(12) United States Patent
Faria

(10) Patent No.: US 8,407,938 B2
(45) Date of Patent: Apr. 2, 2013

(54) ROTATABLE INSPECTION PORT

(75) Inventor: Desmond P. Faria, Richmond Hill (CA)

(73) Assignee: Powersmiths International Corp., Brampton, ON (CA)

( * ) Notice: Subject to any disclaimer, the term of this patent is extended or adjusted under 35 U.S.C. 154(b) by 838 days.

(21) Appl. No.: 12/289,808

(22) Filed: Nov. 5, 2008

(65) Prior Publication Data

US 2010/0107496 A1   May 6, 2010

(51) Int. Cl.
  *B65D 51/18* (2006.01)
(52) U.S. Cl. ............ 49/149; 49/171; 359/508; 359/359; 220/254.2; 220/254.8
(58) Field of Classification Search ............... 220/254.8, 220/259.3, 254.1, 254.2, 256.1, 259.4, 820; 49/171, 149; 359/508, 359
  See application file for complete search history.

(56) References Cited

U.S. PATENT DOCUMENTS

| | | | |
|---|---|---|---|
| 3,170,383 A | 2/1965 | Hunt | |
| 4,264,203 A | 4/1981 | Pirlet | |
| 4,611,881 A * | 9/1986 | Schmidt et al. | 359/220.1 |
| 4,714,327 A * | 12/1987 | Marshall | 359/364 |
| 4,719,720 A | 1/1988 | Olsen | |
| 5,161,055 A | 11/1992 | Blechschmidt | |
| 5,927,010 A * | 7/1999 | Blechschmidt | 49/21 |
| 7,370,971 B2 * | 5/2008 | Peffer et al. | 353/1 |
| 8,157,380 B2 * | 4/2012 | Peffer et al. | 353/1 |
| 2003/1169518 | 9/2003 | Irani | |
| 2008/0218859 A1 | 9/2008 | Yeh | |

FOREIGN PATENT DOCUMENTS

| | | |
|---|---|---|
| GB | 2 089 519 | 6/1982 |
| GB | 2 265 470 | 9/1993 |

\* cited by examiner

Primary Examiner — Mickey Yu
Assistant Examiner — Kareen Rush

(57) ABSTRACT

The invention relates to an inspection port, and a housing with an inspection port, for use in inspecting an interior volume. The housing has a housing enclosure with an inspection opening at or over which the inspection port is mounted, either directly to the housing enclosure or to a base which in turn is mounted to the housing enclosure. The inspection port has a rotatable assembly, rotatably secured to the housing enclosure or base for rotation about an axis of rotation at the inspection opening. The rotatable assembly has a plate defining an access opening and an inspection enclosure attached to the plate around the access opening and adaptable to extend into the interior volume. The inspection enclosure has a region with a window opening which has a window axis and is adaptable to provide lines of sight into the interior volume.

23 Claims, 10 Drawing Sheets

ROTATABLE INSPECTION PORT

FIELD OF THE INVENTION

The invention relates to an inspection or viewing window or port in a wall or panel, such as would be used to inspect the interior components of a housing enclosing electrical or other objects.

BACKGROUND OF THE INVENTION

It is known to have inspection or viewing windows or ports in opaque walls, panels or other structures to allow a person on one side to see through to, or to inspect conditions on, the other side. For example, in the context of protective metal housings enclosing electrical equipment, such as electrical power transformers, a housing may include one or more small windows so that the condition of the electrical equipment inside the housing can be inspected visually, by infrared thermography (the technique of producing images from the normally invisible infrared spectrum) or by ultraviolet imaging techniques from the exterior of the housing. The ability to make such inspections through a window, without having to remove the housing itself, is important for safety reasons, so that inspectors can make routine inspections of the equipment in operation yet without danger of being exposed to open live electrical equipment, such as electrical shock, arc flash or mechanical movement.

The inspection windows are generally mounted in fixed positions in one or more panels (e.g. sides, top, front, back) of the housing, typically with the plane of the window in or close to the plane of the panel in which the window is mounted. Such inspection windows are located so that the particular portion of the equipment inside that is of interest or concern can be inspected. If it should transpire that a problem arises in a section of the equipment that not visible through an inspection window, then it is unlikely that routine inspections through the inspection windows would reveal same.

The inspection windows can include any suitable transparent material with suitable physical properties (e.g. thickness, size, toughness, heat resistance) that would protect an inspector from potentially harmful conditions inside the housing. Typical examples for visual inspection would be glass and transparent plastics (e.g. polycarbonate). Sometimes, if only basic mechanical protection is required, the window opening could be protected only by an open grille. Examples for infrared thermographic inspection would be various mineral crystals, such as calcium fluoride, germanium, zinc selenide or sapphire (depending on precise application).

One of the potential conditions in electrical equipment that routine inspections seek to identify is overheating, which could be indicative of a more serious underlying problem. For example, electrical connections can become loose with time and, if not identified and repaired in timely manner, could lead to overheating, electrical arcing, short circuiting and a potentially dangerous equipment failure. As compared to connections in good condition, such loose connections tend to cause overheating of the material in the vicinity of the loose connection and as a result that material emits greater amounts of infrared radiation. Overheating can be caused by various other conditions, including broken or oxidized wiring, improper grounding, unbalanced loads and system overloads.

Although infrared radiation cannot be detected by the human eye, infrared cameras (such as those sold by FLIR Systems under the trade-mark FLIR-570 or by Fluke under the trade-mark FLU-120) and similar equipment are capable of sensing, measuring and recording infrared radiation. Through the use of such instruments, the presence of overheating, or 'hot spots', in the electrical equipment can be identified and appropriate remedial action taken thereafter.

Unfortunately, conventional glass and plastic window materials tend to be opaque to infrared and ultraviolet radiation in varying degrees. Accordingly, such materials cannot be used in an inspection window if it is intended to measure such radiation from the other side of the window. In recognition of these difficulties, special materials supported by special window structures (all designed to allow the passage of such radiation) have been developed and put into use. For example, for infrared applications, such windows are sold by Square D, a division of Schneider Electric, under the trademark H VIR COMET and by Global Maintenance Technologies or GM Tech of Chelmsford, UK under the trademarks VP-50 SERIES, VP-75 SERIES and VP-100 SERIES. These latter windows include a filter element made of either calcium fluoride, germanium, zinc selenide or sapphire (depending on precise application), all of which are sufficiently transparent to infrared radiation but in some cases may be opaque to visible light. As shown in the Prior Art FIG. 1, the filter is held by an annular frame across which the filter (and, for some filter materials, a supporting protective latticework) are positioned. In addition, the manufacturer of this device includes, and recommends usage of, a protective cover, to be opened only during an inspection operation. The use of such a window allows an infrared camera or detector to look into the housing to detect and measure the infrared radiation emitted by the equipment within view.

Typically, the physical properties of such special filter materials limit the field of view that any particular window can have. First, the mechanical properties of the filter material (even though supported by a latticework structure) and cost factors may limit the physical size of the window to the order of several inches. Second, in the case of infrared filter materials, the optimum viewing angle through such filters is typically about plus or minus 30 degrees from the vertical to the plane of the filter, although some useful information can be extracted for about an additional 15 degrees on either side. However, if the viewing angle exceeds about 45 degrees from the vertical, the transmission of infrared radiation through the filter falls off significantly. In addition, as the viewing angle increases from 45 degrees, the geometry of the filter and its supporting structure may interfere with a clear line of sight. In short, for various reasons, the field of view of such windows can be relatively limited.

If there are large-size or multiple zones of equipment that ideally should be monitored by inspection, because of the small physical size and the limited field of view of the viewing windows described above, multiple windows may have to be used. As each window is relatively expensive, the overall cost of manufacturing and operating housings can be substantially increased. Alternatively, to keep costs down, fewer windows may be used but with a consequent reduction in ability to inspect effectively and with potential safety implications.

There thus remains a need for a viewing window structure which will allow convenient and safe inspection of a larger zone of the interior of a housing.

SUMMARY OF THE INVENTION

The present invention is directed to an inspection port, for use in association with a panel defining a side of an interior volume to be inspected and also defining an inspection opening, comprising a base, adaptable to be secured to the panel, a rotatable assembly, rotatably secured to the base for rotation about an axis of rotation at the inspection opening, the assembly comprising a plate defining an access opening and an inspection enclosure attached to the plate around the access opening and adaptable to extend into the interior volume, the enclosure having a region defining a window opening having a window axis and adaptable to provide lines of sight into the interior volume.

In another aspect, the invention is directed to a housing, for use in association with equipment to be enclosed thereby, comprising a housing enclosure, defining an interior volume, adaptable to enclose the equipment whereby said equipment will be located in the interior volume, the housing enclosure having an inspection opening, a rotatable assembly, rotatably secured to the housing enclosure for rotation about an axis of rotation at the inspection opening, the rotatable assembly comprising a plate defining an access opening, an inspection enclosure attached to the plate around the access opening and extending into the interior volume, the inspection enclosure having a region defining a window opening having a window axis and adaptable to provide lines of sight into the interior volume towards the equipment to be enclosed therein.

IN THE DRAWINGS

Preferred embodiments of the present invention are illustrated in the attached drawings in which.

DETAILED DISCLOSURE

A preferred embodiment of a housing and inspection window structure of the present invention is illustrated in the attached Figures.

Figure 1:
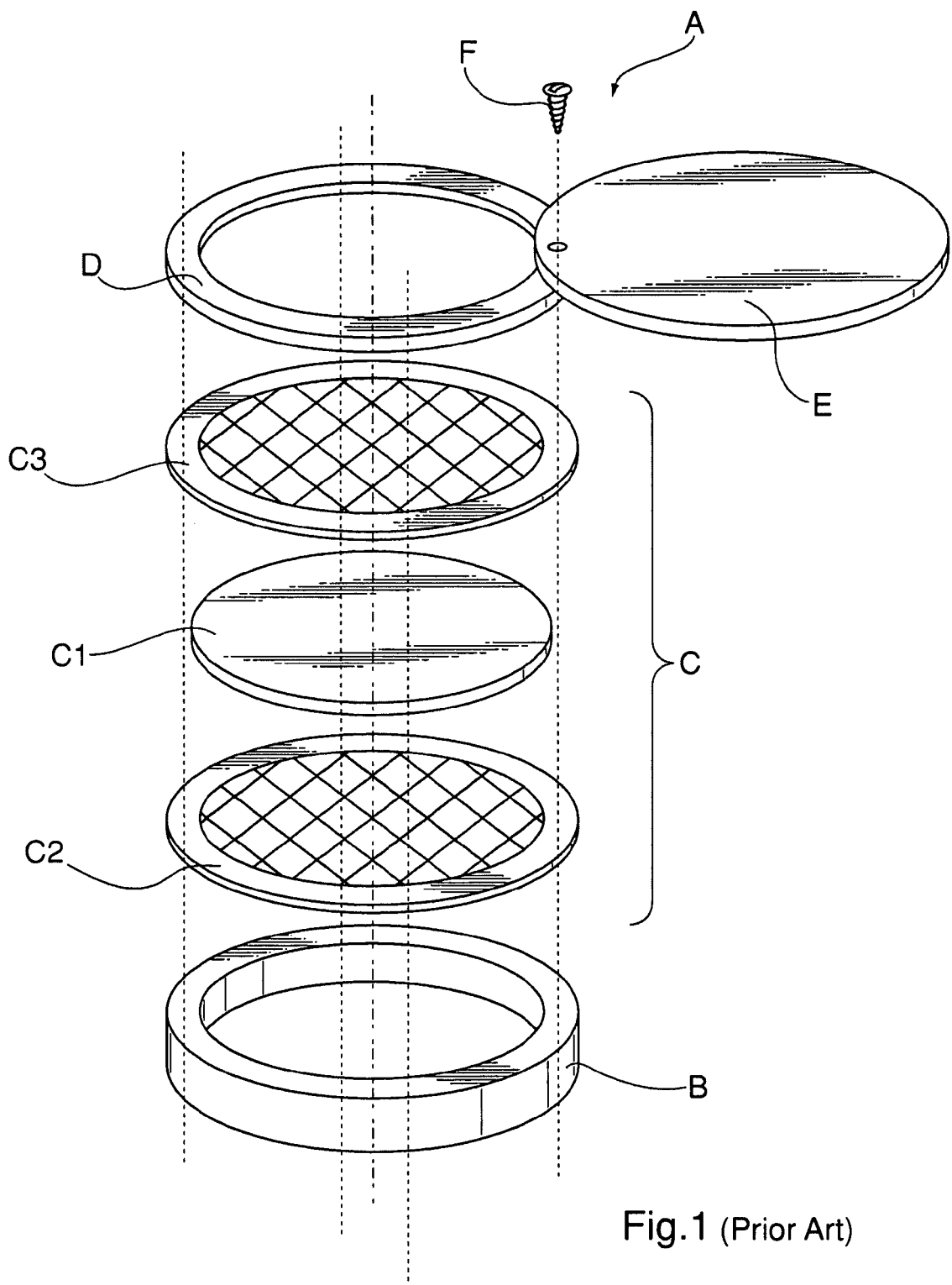
FIG. 1 is an exploded view of a prior art infrared filter window.

Referring first to FIG. 1, the general structure of a prior art filter window A is shown. It comprises a layered structure, starting first with an annular base B which defines an internal aperture and a window axis. Next, supported thereon is a sandwich structure C, comprising the infrared filter material C1 with upper and lower supporting lattices C2 and C3, extending across the aperture. Lattices C2 and C3 protect and provide lateral support to the filter material C1 in cases where required. In some applications or in the case of some filter materials, lattices C2 and/or C3 may not be required. Finally, there is an annular retention ring D. Parts B to D are held together by suitable fastening means (not shown). Preferably, window A is additionally supplied with a cover E which may be held in place by a screw F, so that it may rotate under friction resistance from an open position (as illustrated in FIG. 1) to a closed position across the top of retention ring D.

Figure 2:
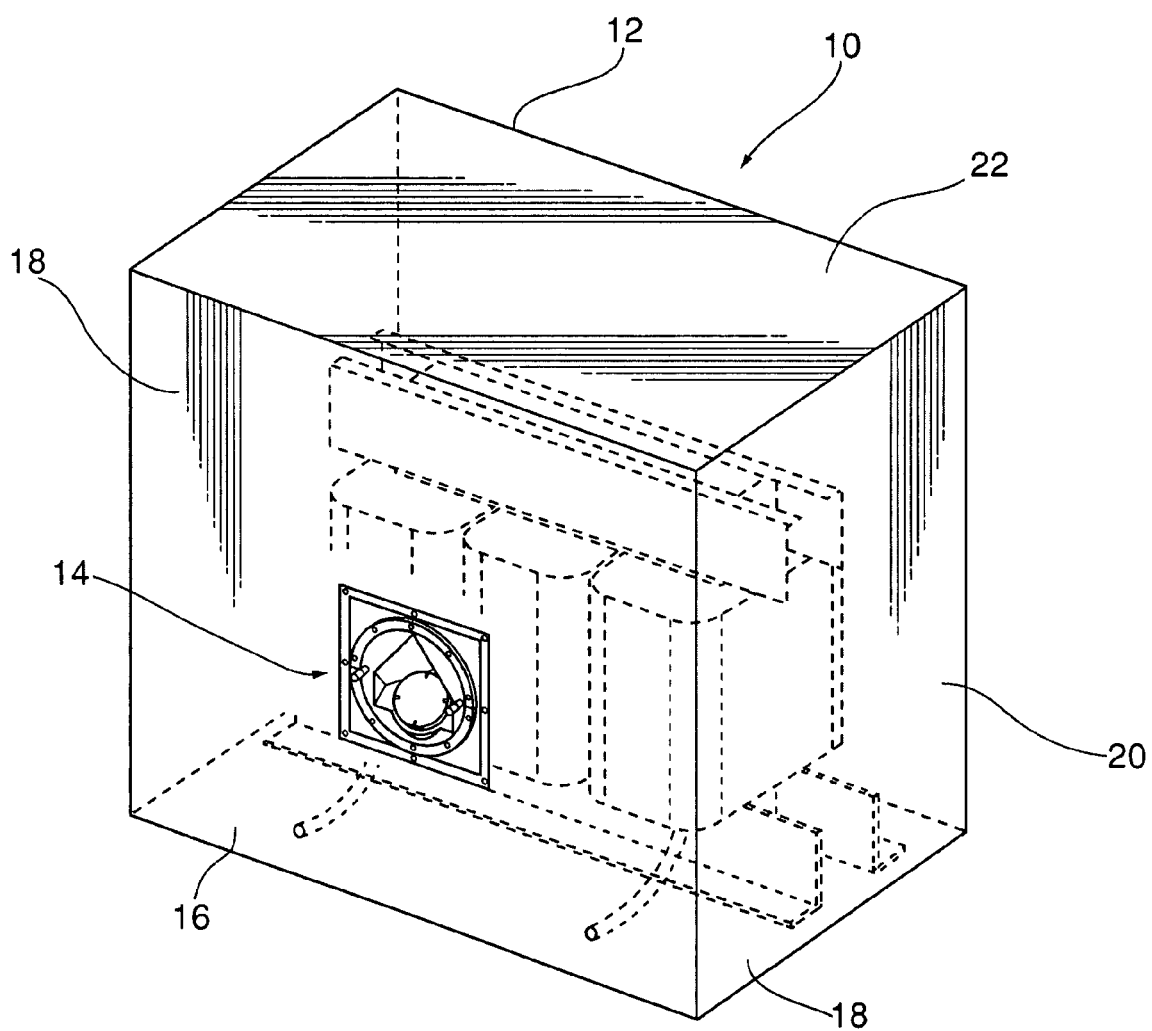
FIG. 2 is a perspective view of housing for electrical equipment incorporating an inspection port according to the invention.

Referring now to FIG. 2, there is shown a housing 10 which incorporates a housing enclosure 12 and an inspection port 14 according to the invention. In general, housing enclosure 12 may consist of a front panel 16, side panels 18, a back panel 20 and a top panel 22. Housing enclosure 12 defines an interior volume into which inspection port 14 provides inspection access. Housing enclosure 12 is mounted to a base (not shown) and encloses and protects equipment located in the interior thereof. In the illustrated embodiment, an electrical transformer structure is shown in schematic outline.

Although a generally right rectangular prismatic shape is shown for housing enclosure 12, other housing enclosure configurations, shapes and arrangements of panels, walls or other enclosures or enclosing structures may be used.

In the illustrated embodiment, although only one inspection port 14 is shown, located in front panel 16, in other embodiments multiple inspection ports 14 could be used in a housing 10, for example if the housing were very large or there were interior obstacles interfering with an inspector's ability to inspect. By way of non-limiting example only, additional inspection ports 14 could be added to side panels 18, rear panel 20 and top panel 22, if it were necessary to inspect conditions in those areas.

Although inspection ports 14 could be located anywhere in a housing 10, in the particular context of a housing for an electrical transformer (for which wiring and cabling tends to be concentrated adjacent the sides and bottoms of the interior of the housing), it may be advantageous in some cases to place an inspection port 14 generally in the middle of a panel, such as in the middle of front panel 16 as shown in FIG. 2, where installation of the port 14 will not interfere with normal wiring practices.

Furthermore, although the use of the inspection port 14 according to the invention is illustrated in connection with the structure of a fully enclosed housing 10, an inspection port 14 according to the invention may in fact be used in any suitable situation where it is desirable to inspect conditions on one side of a panel or wall from a protected environment on the other side of the wall. By way of non-limiting example, if conditions inside a room were such that it would be dangerous for an inspector to enter, then an inspection port 14 according to the invention may be placed in a wall, door or ceiling of such room.

Figure 3:
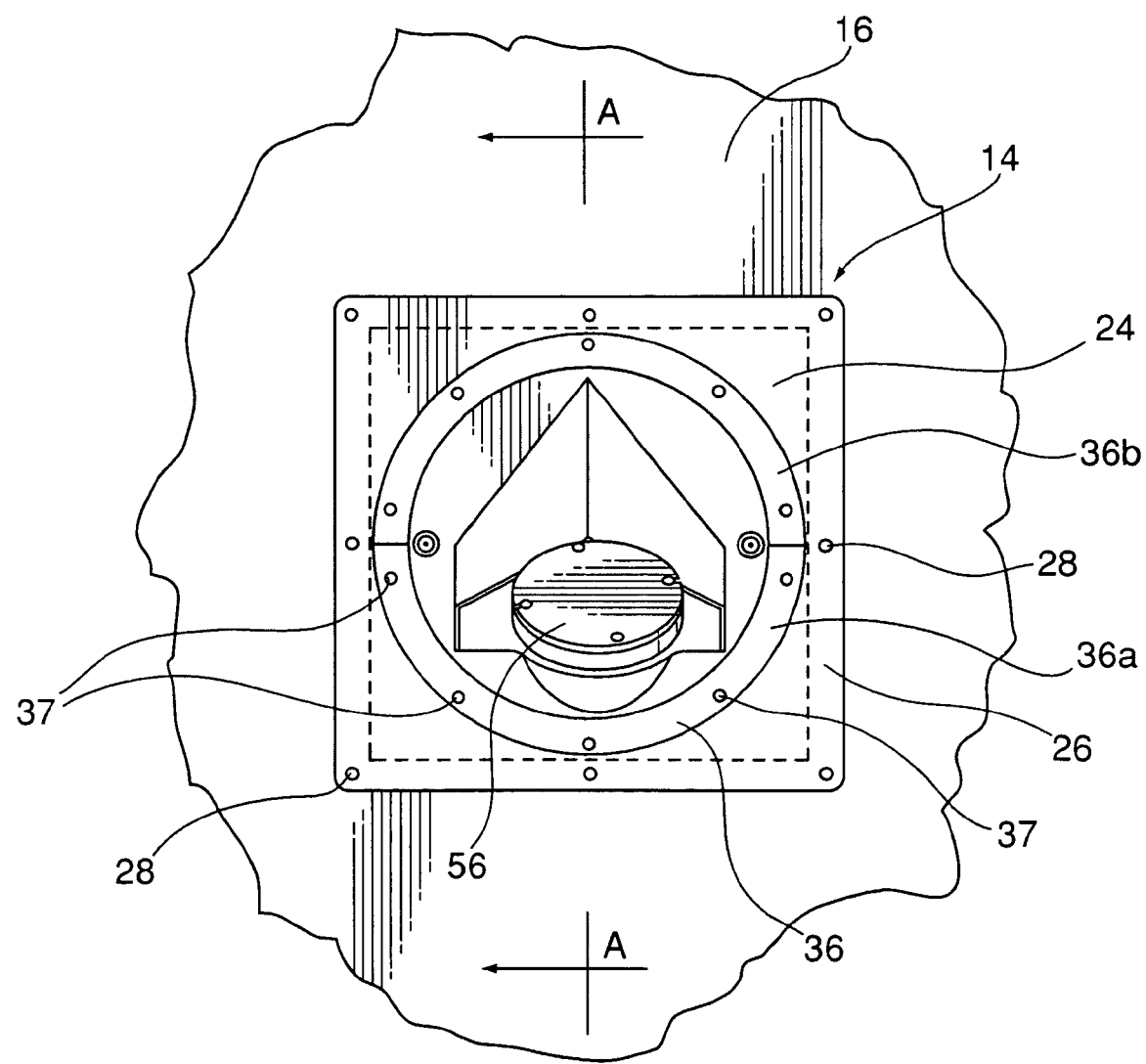
FIG. 3 is an elevation view of an inspection port according to the invention.
Figure 4:
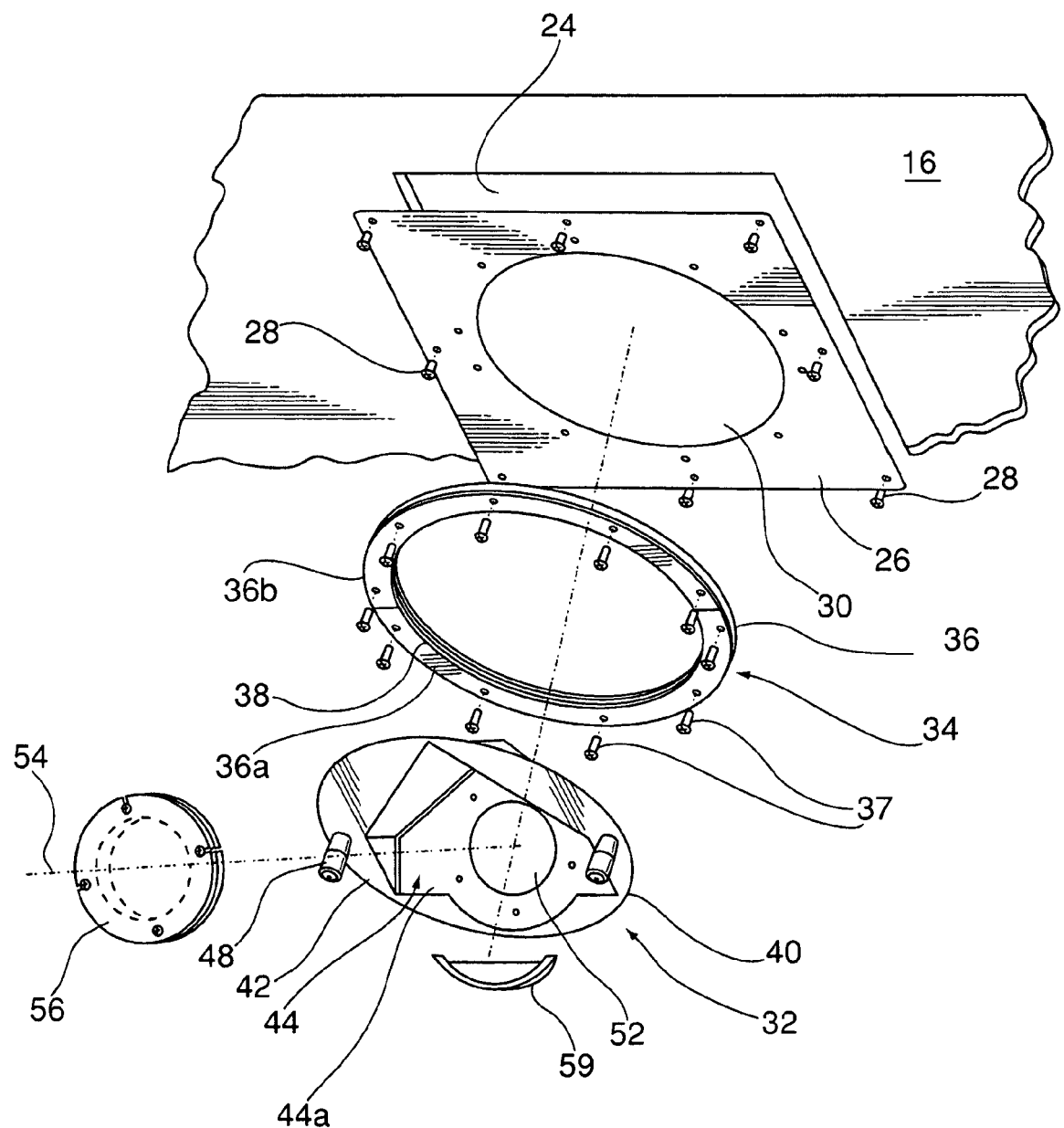
FIG. 4 is an exploded view of an inspection port according to the invention.

Referring to FIGS. 3 and 4, an inspection port 14 is shown mounted in panel 16. Panel 16 defines an inspection opening 24 over or within which inspection port 14 is mounted.

As shown in the illustrated embodiment, inspection port 14 preferably includes a base 26 of a suitable size to cover panel opening 22 and allow secure fastening to panel 16. For example, screws 28 are illustrated for such purpose but any suitable fastening means, including welding, could be used. As best shown in FIG. 4, base 26 defines a circular opening 30, so as to allow access from or through base 26 to inspection opening 24.

A rotatable assembly 32 is rotatably held by a rotation support structure 34 attached to base 26. In the illustrated embodiment, the rotation support structure 34 comprises an annular retaining ring 36 which defines a circumferential inner support groove 38 extending around the inner circumference of annular ring 36. Groove 38 is sized to receive and rotatably hold a circumferential edge 40 of rotatable assembly 32. Preferably, retaining ring 36 is made of low-friction material, such as nylon or TEFLON® material, thus eliminating the need for separate low-friction bushings. To allow assembly, retaining ring 36 is split into at least two arcuate pieces, for example as illustrated two ring pieces 36a and 36b, which may be separately attached to base 26 (for example, by screws 37) or otherwise secured together and to base 26.

In some embodiments (not shown), it may be preferred to eliminate base 26 and attach the rotation support structure 34, such as the arcuate pieces 36a and 36b of retaining ring 36, directly to panel 16 around the edges of inspection opening 24.

Although annular retaining ring 36 is shown as a full 360 degree annular structure, in other embodiments (not shown), the arcuate pieces thereof may define only discrete arcs of a full circle. Alternatively, other suitable bearing means may be used.

Figure 5:
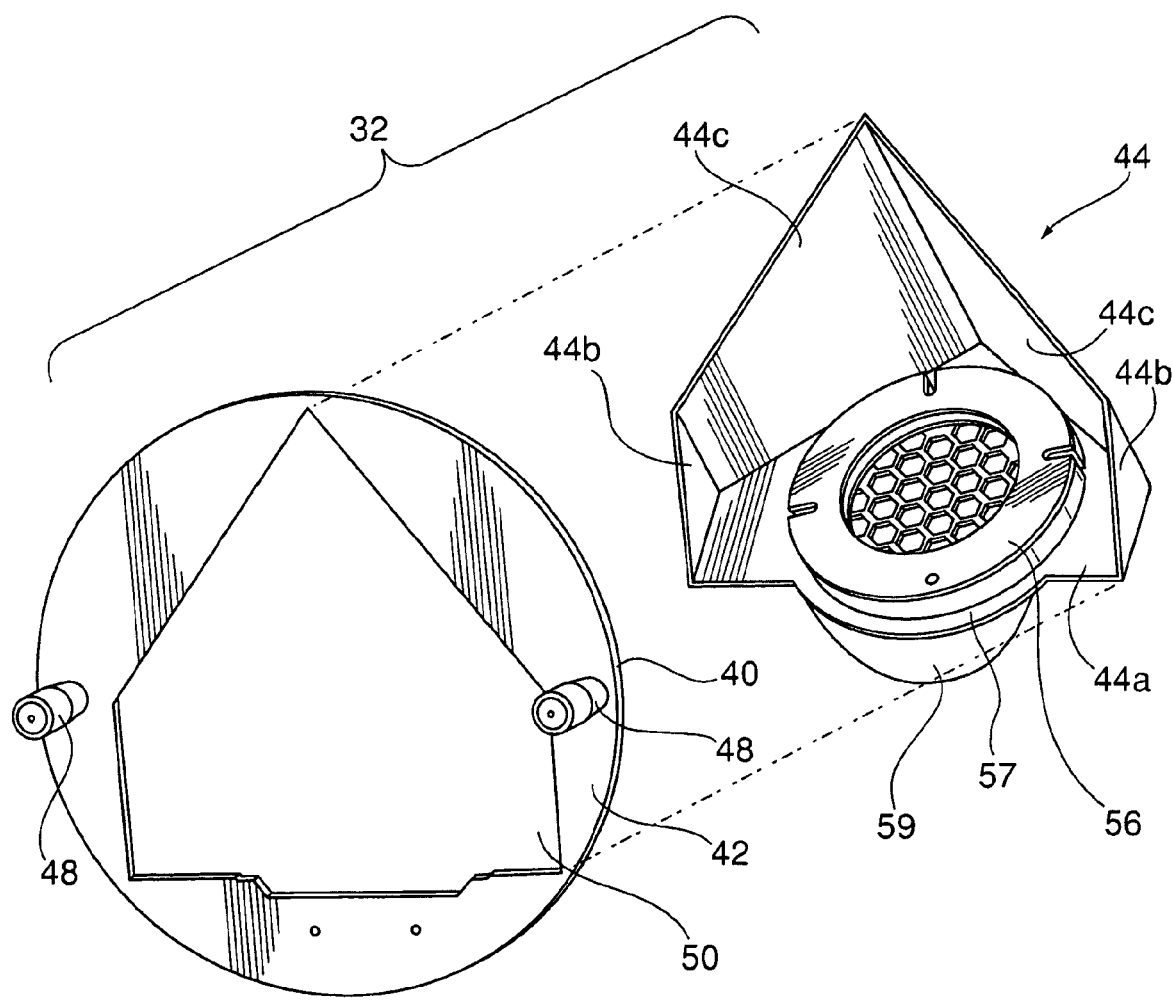
FIG. 5 is an exploded view of a rotatable assembly as incorporated into an embodiment of an inspection port according to the invention.

Referring to FIG. 5, rotatable assembly 32 comprises a circular plate 42 to which an inspection enclosure 44 is attached as described below. Rotatable assembly 32 defines "interior" and "exterior" sides, namely sides facing toward and away from respectively the interior of housing 10, and an axis of rotation 46 (shown in FIG. 6). Rotatable assembly 32 preferably has handles 48 attached to its exterior side, to assist in allowing manual rotation of assembly 32 in the manner described below.

In an alternate embodiment (not shown), the manual rotation of assembly 32 described above could be augmented or replaced by any suitable powered rotation means, such as electric motor means.

Circular plate 42 defines circumferential edge 40 which is engaged and supported, as described above, by rotation support structure 34. Plate 42 is sized to cover inspection opening 30.

Figure 6:
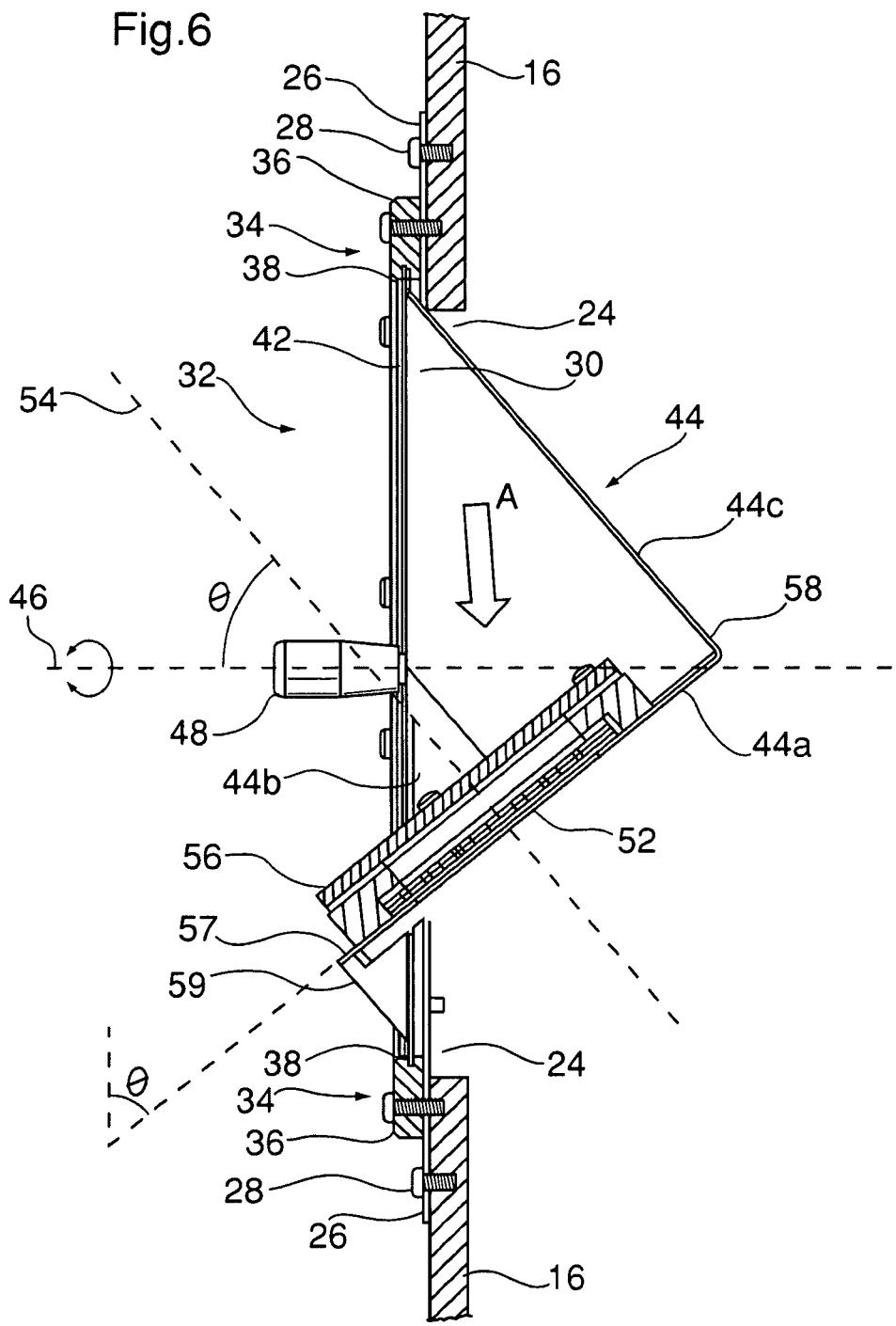
FIG. 6 is a cross-sectional view along the line A-A of FIG. 3.
Figure 7:
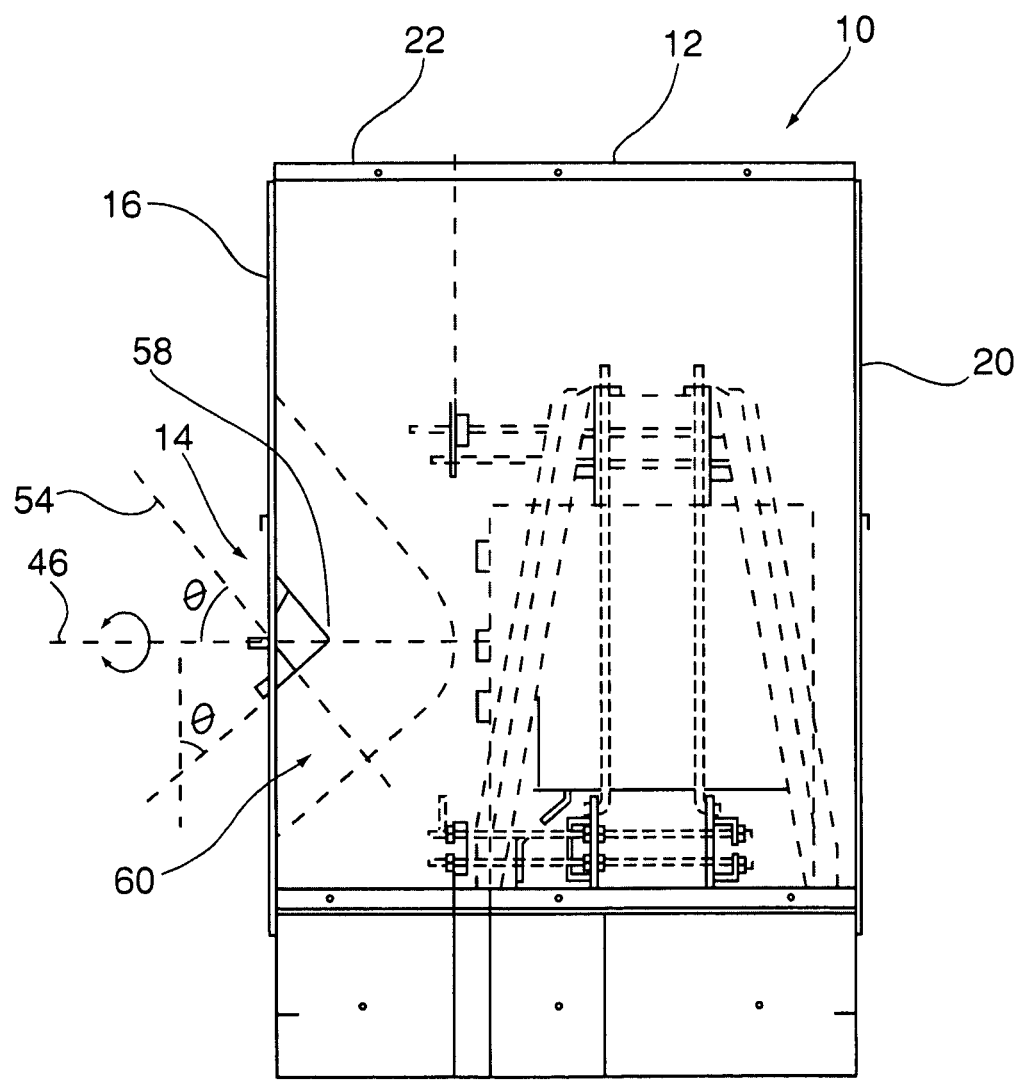
FIG. 7 is a cross-sectional view of a housing according to the invention.

Referring to FIG. 5, circular plate 42 additionally defines an access opening 50, which in the illustrated example is pentagon-shaped. Inspection enclosure 44 is attached, by any suitable means such as welding, to plate 42 around the perimeter of opening 50, on the interior side thereof, and extends into the interior volume of housing 10 (as best shown in FIGS. 6 and 7). In the particular embodiment illustrated, inspection enclosure 44 generally defines a polyhedron shape, developed from 5 planar pieces—a generally pentagon-shaped base piece 44a, two triangular side pieces 44b and two trapezoidal pieces 44c with pieces 44a and 44c meeting at tip 58.

Inspection enclosure 44 has a region which defines a window opening 52 having a window axis 54 (as shown in FIGS. 4 and 6). In the illustrated embodiment, the region of enclosure 44 which defines window opening 52 is base piece 44a adjacent the edge attached to plate 42. Preferably, the precise positioning of window opening 54 will be such that an inspector will be provided with lines of sight into the interior volume of housing 10 towards the equipment to be monitored and alongside the interior edge of panel 16, for example as shown by arrows A in FIGS. 6 and 8.

Figure 8:
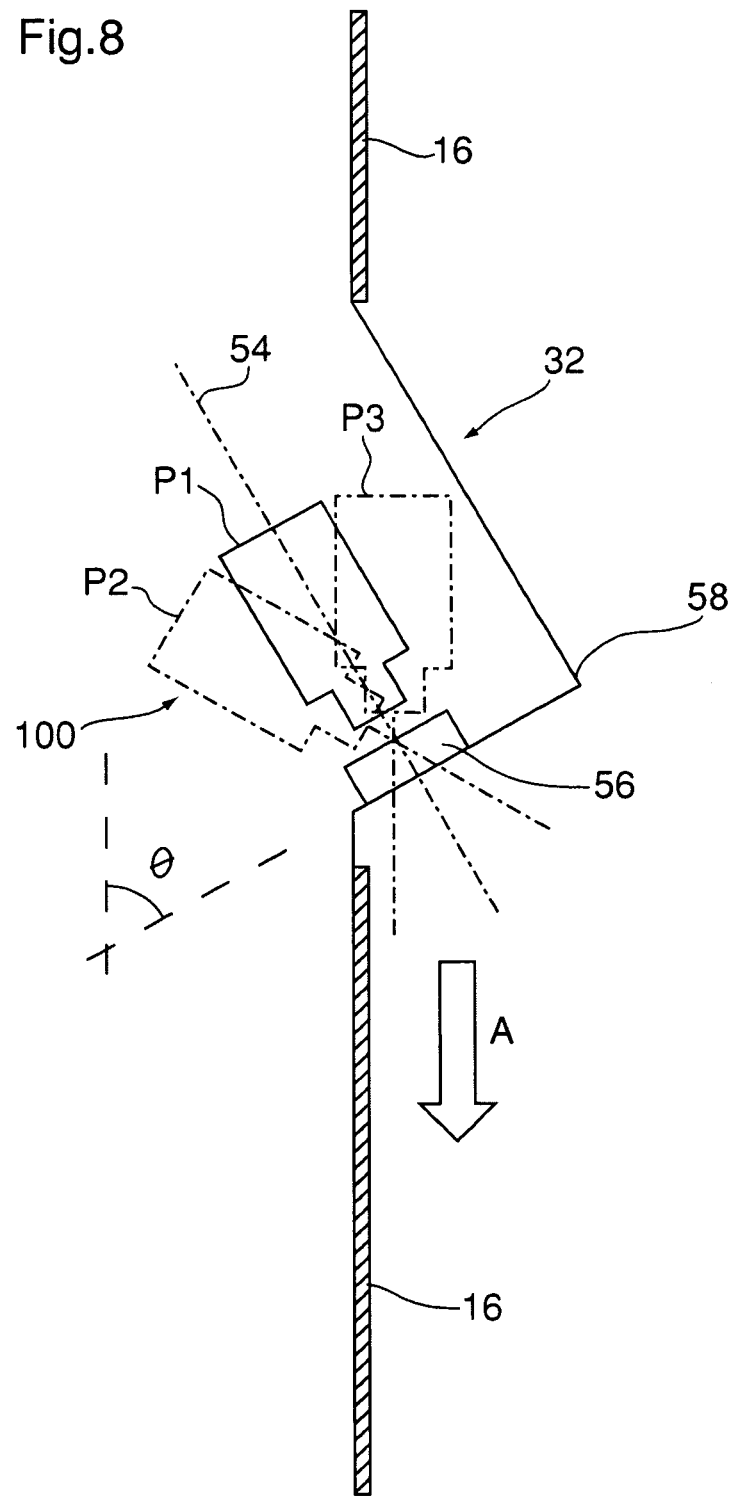
FIG. 8 is a schematic diagram illustrating the use of a camera with an inspection port according to the invention.

Although other shapes (e.g. a hemisphere) for enclosure 44 could be used with suitable modifications that would be apparent to a skilled technician, the pentagon-shape of access opening 50 and the cooperating polyhedral shape of enclosure 44 have been found to have certain particular advantages. In particular, as shown in FIG. 8, when an infrared or other camera 100 is used, a preferred position would be along window axis 54 (position P1). However, it is likely that an inspector will additionally wish to tilt the camera 100 off of axis 54 so as to get a better view in different directions of conditions inside housing 10. On one hand, if the camera 100 is angled from the on-axis position P1 to off-axis position P2 (for example to get a better line of sight in a more horizontal direction), no difficulties will ensue. On the other hand, if the camera 100 is angled from the on-axis position P1 to off-axis position P3 (for example to get a better line of sight along the interior side of panel 16 in the direction of arrow A), depending on the size and shape of the camera body, its upper portion may come into contact with the opposite side of rotatable assembly 32. The use of the pentagon-shape tends to lessen such a potential problem by providing more space at that opposite side of the structure to allow for an angled camera body.

Other advantages of the polyhedral shape of enclosure 44 are that, because it is made of a small number of planar pieces, it is relatively simple and inexpensive to manufacture and its design may be conveniently and easily altered for specific applications.

In the illustrated embodiment, an inspection window structure 56 is attached by any suitable means to inspection enclosure 44 at window opening 52. Any suitable viewing window structure may be used. For example, as illustrated, for the purpose of infrared thermographic inspection, inspection window structure 56 may be a prior art infrared filter window as described above and generally illustrated in FIG. 1. Alternatively, for visual inspection, window structure 56 may be of the conventional glass or plastic window pane-type or the protective grille-type, depending on the precise application. In the further alternative for ultraviolet inspection, a window structure with a suitable ultraviolet filter may be used.

Depending on the type of window structure selected, there may be different limits to the maximum off-axis viewing angle. In the case of an infrared filter window, as noted above, the effective maximum off-axis viewing angle is about 45 degrees with the optimum range being up to about 30 degrees. Other types of window structures, such as those with glass or plastic panes or ultraviolet filters or even just protective grilles, will similarly have limits (e.g. imposed by optical properties or mechanical aspects of the window structure) to their maximum off-axis viewing angles but those limits may be different from those for infrared filter windows and also from each other.

To allow the aperture of inspection window structure 56 to sit as closely as possible to the interior edge of panel 16, enclosure base piece 44a may be provided with a support lip 57 to support the base of inspection window structure 56, which for esthetic reasons may be concealed by trim piece 59.

As best shown in FIGS. 6 to 8, the plane of base piece 44a is angled relative to the plane of circular plate 42 by an angle θ, which by geometry is same as the angle between window axis 54 and rotation axis 46. Angle θ may be selected according to the required field of view for window opening 52, which will depend upon location of inspection port 14 relative to the location and size of the zone to be inspected. For example, the required field of view will depend upon the apparent angular size of certain equipment to be monitored (which is a function of the actual size of the equipment and its distance away from window opening 52). The selection of angle θ may also take into account any applicable limits to the maximum off-axis viewing angle for the particular window structure 56 chosen.

Preferably, angle θ will be selected so that window axis 54 will be oriented toward the centre of the zone to be monitored, which (with the possibility of having lines of sight up to as much as 30 to 45 degrees off of such axis 54 in the case of the infrared filter window-type) will allow for maximum inspection coverage.

By way of non-limiting examples only, if the centre of the zone to be monitored is at a location close to the rotation axis 46 and the angular size of the zone is relatively small, then angle θ may be relatively small. However, as is more often the case, if the centre of the zone to be monitored is located significantly away from rotation axis 46, then angle θ will be higher. In applications where it is desired to maximize the potential field of view (e.g. many applications in connection with transformer housings), it may be theoretically considered that angle θ should be about 45 degrees. However, taking into account the limits of off-axis viewing, in practice it has been found that angle θ should be in the range of about 45 to 55 degrees and preferably about 50 degrees.

At this angle, combined with a line of sight tilted by as much as 30 to 45 degrees off-axis 54, the interior side of panel 16 may be readily viewed and inspected. However, it will also be noted that at an angle of 50 degrees there may be some decrease in visibility in the direction of rotation axis 46 but in the typical transformer application this has not proven to be problematic.

Figure 9:
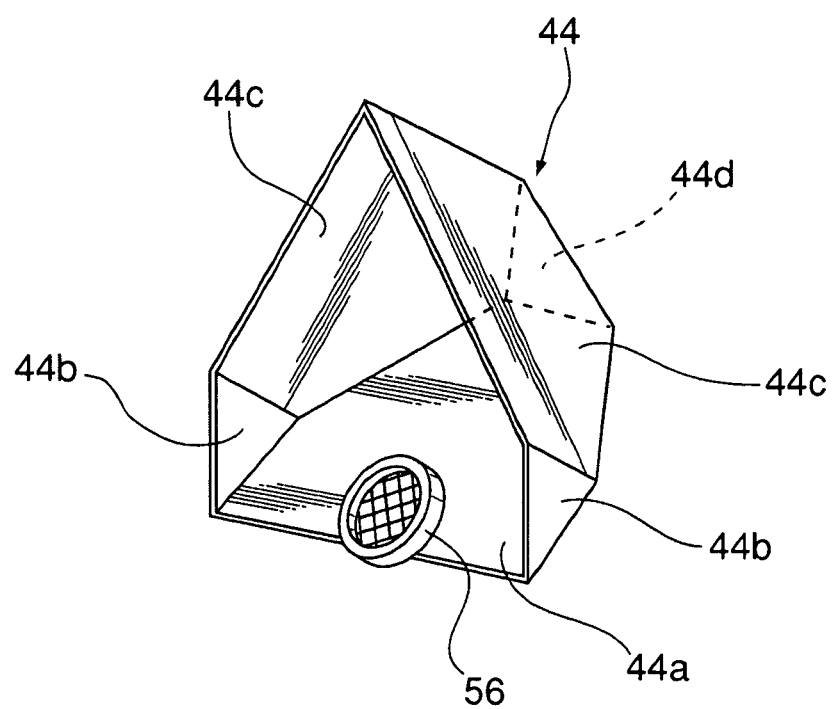
FIG. 9 is a perspective view of an inspection enclosure as incorporated into an alternate embodiment of an inspection port according to the invention; and, FIG. 10 is a cross-sectional view of an alternate embodiment of an inspection port according to the invention.

Referring to FIGS. 6 to 8, it will be noted that the interior tip 58 of enclosure 44 is located some distance into the interior volume of housing 10. In designing housing 10, care must be taken to ensure that enclosure 44 and tip 58 are not sufficiently close to the live electrical equipment thereinside that problems such as electrical arc flashing could occur. Accordingly, a minimum clearance zone 60 of about 2 to 12 inches (depending on the voltage of the equipment within the enclosure—for example, low voltage systems may have a minimum clearance of 2 inches, medium voltage systems of 6 inches and high voltage systems of 12 inches) should be maintained between enclosure 44 and its tip 58 and the nearest live electrical equipment. If interior space is limited, in an alternate embodiment shown in FIG. 9, the entire tip region of enclosure 44 could be truncated and replaced by triangular tip panel 44*d*.

Figure 10:
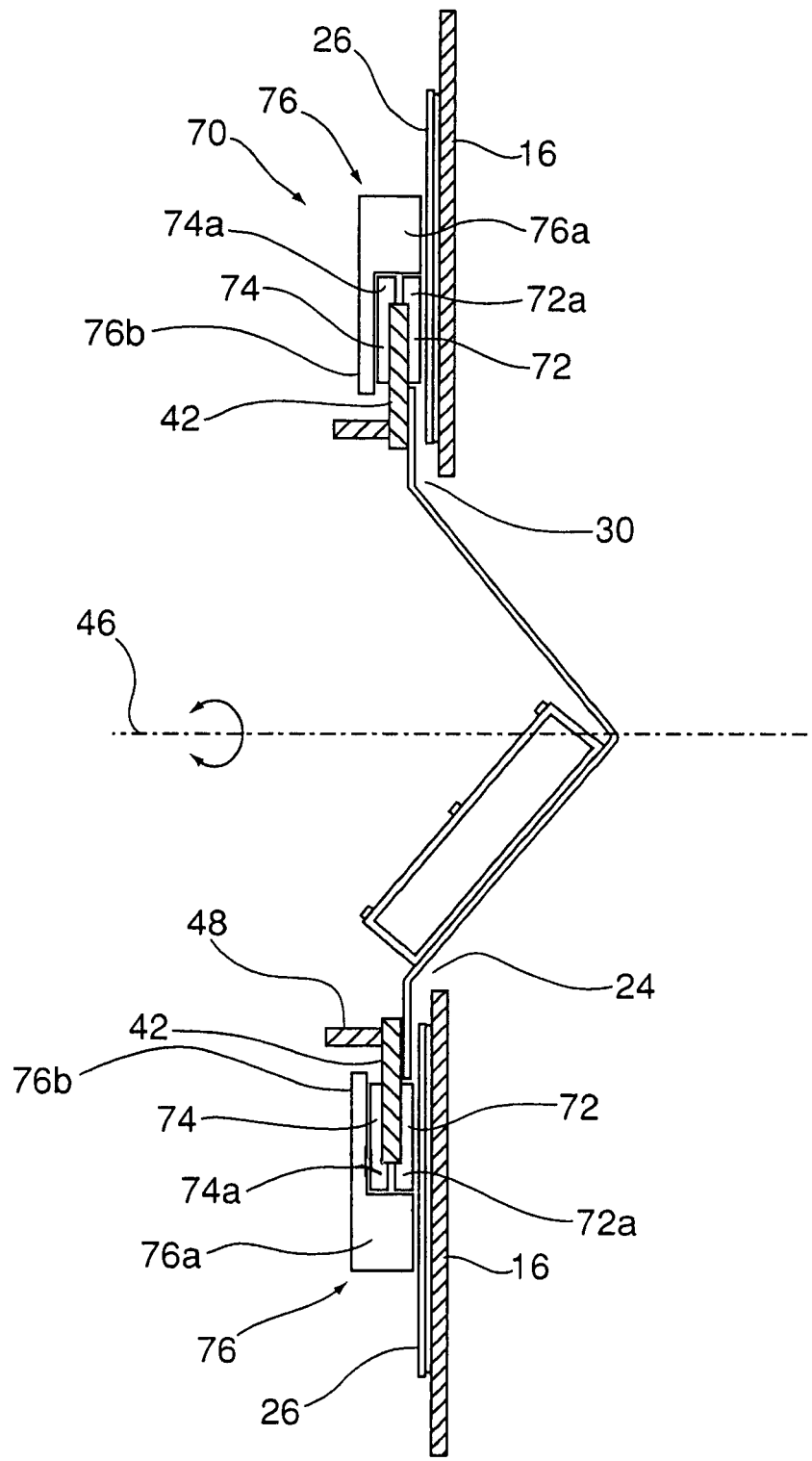

Referring now to FIG. 10, there is shown a cross-section of an alternate rotation support structure 70 attached to base 26. In this embodiment, the rotation support structure 70 is annular in shape and comprises a first annular bushing 72 located adjacent base 26 around circular opening 30. Circular plate 42 is located adjacent bushing 72. Circular plate 42 is held in place adjacent circular opening 30 by means of a second annular bushing 74 and annular retaining ring 76. Each of bushings 72 and 74 may define shoulder areas 72*a* and 74*a*, respectively, located at their radially outward edges to assist in the secure positioning and retention of the assembly of bushings 72 and 74 and circular plate 42. Retaining ring 76 defines a base portion 76*a* at its radially outward edge and a flange portion 76*b* at its radially inward edge. Base portion 76*a* is mounted to base 26 by any suitable means, for example by screws (not shown). Flange portion 76*b* holds bushings 72 and 74, with circular plate 42 sandwiched therebetween, in place against base 26. Preferably, bushings 72 and 74 are made of a low-friction material, such as nylon or TEFLON® material, to allow circular plate 42 to rotate easily by hand about its axis 46.

In an alternate version of this embodiment (not shown), retaining ring 76 may itself be made out of a low-friction material, again such as nylon or TEFLON® material, and bushing 74 eliminated as a separate element.

In other embodiments (not shown), in environments where it is desirable to prevent the ingress or egress of contaminating material into or out of the interior volume, suitable sealing means may be added to the inspection port and housing according to the invention. For example, all components of rotatable assembly 32 and their connections may be closed or sealed. In additional, rotational sealing means may be added between rotatable assembly 32 and rotation support structure 34 or housing enclosure 12.

In operation, rotatable assembly 32 and the elements mounted thereto, namely enclosure 44 and inspection window structure 56, may be rotated through 360 degrees, either manually by handles 48 as in the illustrated embodiments or by powered means. It will be appreciated that, in turning assembly 32 about its axis 46 through 360 degrees, window axis 54 will be rotated through space describing a cone with an apex angle of 2θ. In addition, a line of sight at 30 degrees off-axis 54 will similarly be rotated through space describing a cone with an apex angle 2*(θ+30 degrees). If the line of sight is 45 degrees off-axis 54, a cone with an apex angle 2*(θ+45 degrees) will be described. If the line of sight is 45 degrees off-axis 54 in the other direction, a cone with an apex angle 2*(θ−45 degrees) will be described. If θ is the preferred 50 degrees noted above, then in fact the rotation of plate assembly through a full 360 degrees will allow lines of sight from the location of inspection port 14 toward any equipment on the interior of housing 10, with the possible exception of lines of sight near to rotation axis 46.

An inspector may therefore by rotating assembly 32 have clear lines of sight toward, and can thus inspect, all relevant equipment either visually or with the aid of instrumentation such as infrared cameras or related or other equipment.

Although various preferred embodiments of the present invention have been described herein in detail, it would be appreciated by those skilled in the art that variations may be made thereto The embodiments of the invention in which an exclusive property or privilege is claimed are defined as follows:

1. An inspection port, for use in association with a panel defining a side of an interior volume to be inspected and also defining an inspection opening, comprising:
   a base, adaptable to be secured to the panel; and
   a viewing assembly, rotatably secured to the base for rotation about an axis of rotation at the inspection opening, the viewing assembly comprising a plate defining an access opening and an inspection enclosure attached to the plate around the access opening and adaptable to extend into the interior volume, the inspection enclosure having a region defining a window opening having a window axis and adaptable to provide lines of sight into the interior volume, wherein the region of the inspection enclosure defining the window opening is angled relative to the plate whereby the window axis is angled relative to the axis of rotation and wherein the plate and the inspection enclosure are fixed together and as part of the viewing assembly rotate together relative to the base.

2. An inspection port according to claim 1 further comprising an inspection window structure attached to the enclosure at the window opening.

3. An inspection port according to claim 2 wherein the inspection window structure comprises an infrared filter window.

4. An inspection port according to claim 3 wherein the plate is circular and is secured to the base at the outer circumference of the plate by a rotation support structure.

5. An inspection port according to claim 4 wherein the rotation support structure comprises an annular retaining ring assembly defining an inner support groove in which the outer circumference of the plate is held.

6. An inspection port according to claim 5 wherein the annular retaining ring assembly comprises at least two arcuate pieces integrally made of low friction material.

7. An inspection port according to claim 6 wherein the window axis is angled relative to the axis of rotation in the range of about 45 to 55 degrees.

8. An inspection port according to claim 7 wherein the window axis is angled relative to the axis of rotation at about 50 degrees.

9. An inspection port according to claim 8 wherein the access opening is pentagon-shaped.

10. An inspection port according to claim 5 wherein the annular retaining ring assembly comprises an annular retaining ring attached to the base and defining a radially inwardly extending support flange, wherein the outer circumference of the plate is supported between the support flange and the base.

11. An inspection port according to claim 10 wherein the annular retaining ring assembly further comprises a first annular bushing between the plate and the base and a second annular bushing between the plate and the support flange.

12. An inspection port according to claim 5 wherein the base defines a base opening and is adaptable to substantially cover the inspection opening except at the base opening.

13. A housing, for use in association with one or more objects to be enclosed thereby, comprising:
a housing enclosure, defining an interior volume, adaptable to enclose the objects whereby said objects will be located in the interior volume, the housing enclosure having an inspection opening; and,
a viewing assembly, rotatably secured to the housing enclosure for rotation about an axis of rotation at the inspection opening, the viewing assembly comprising a plate defining an access opening and an inspection enclosure attached fixed to the plate around the access opening and extending into the interior volume, the inspection enclosure having a region defining a window opening having a window axis and adaptable to provide lines of sight into the interior volume towards the objects to be enclosed therein, wherein the region of the inspection enclosure defining the window opening is angled relative to the plate whereby the window axis is angled relative to the axis of rotation and wherein the plate and the inspection enclosure are fixed together and as part of the viewing assembly rotate together relative to the housing.

14. A housing as claimed in claim 13 further comprising an inspection window structure attached to the inspection enclosure at the window opening.

15. A housing as claimed in claim 14 wherein the inspection window structure comprises an infrared filter window.

16. A housing as claimed in claim 15 wherein the plate is circular and is secured to the housing enclosure at the outer circumference of the plate by a rotation support structure.

17. A housing as claimed in claim 16 wherein the rotation support structure comprises an annular retaining ring assembly defining an inner support groove in which the outer circumference of the plate is held.

18. A housing as claimed in claim 17 wherein the annular retaining ring assembly comprises at least two arcuate pieces integrally made of low friction material.

19. A housing as claimed in claim 18 wherein the window axis is angled relative to the axis of rotation in the range of about 45 to 55 degrees.

20. A housing as claimed in claim 19 wherein the window axis is angled relative to the axis of rotation at about 50 degrees.

21. A housing as claimed in claim 20 wherein the access opening is pentagon-shaped.

22. A housing as claimed in claim 21 wherein the annular retaining ring assembly comprises a base attached to the housing enclosure and an annular retaining ring attached to the base, the ring defining a radially inwardly extending support flange, wherein the outer circumference of the plate is supported between the support flange and the base.

23. A housing as claimed in claim 22 wherein the annular retaining ring assembly further comprises a first annular bushing between the plate and the base and a second annular bushing between the plate and the support flange.

* * * * *